United States Patent [19]

Ley

[11] 4,144,577

[45] Mar. 13, 1979

[54] INTEGRATED QUANTIZED SIGNAL SMOOTHING PROCESSOR

[75] Inventor: Gordon S. Ley, Arnold, Md.

[73] Assignee: The United States of America as represented by the Secretary of the Air Force, Washington, D.C.

[21] Appl. No.: 842,140

[22] Filed: Oct. 14, 1977

[51] Int. Cl.² ............................ G06F 7/38; H03K 4/02
[52] U.S. Cl. .................................. 364/571; 307/264; 328/156; 340/347 R
[58] Field of Search .................. 364/571, 575, 570; 328/135, 137, 147, 149, 156, 158, 165, 162; 307/227, 264; 340/347 AD, 347 R

[56] References Cited

U.S. PATENT DOCUMENTS

| | | | |
|---|---|---|---|
| 3,560,957 | 2/1971 | Miura et al. | 340/347 AD |
| 3,622,765 | 11/1971 | Anderson | 364/575 |
| 3,628,061 | 12/1971 | Jackman | 307/227 |
| 3,701,954 | 10/1972 | Seminatore et al. | 307/227 |
| 3,826,927 | 7/1974 | Halfhill | 307/227 |
| 3,872,389 | 3/1975 | Willard | 328/147 |
| 3,877,022 | 4/1975 | Lehman et al. | 340/347 AD |
| 3,942,173 | 3/1976 | Wold | 340/347 AD |

Primary Examiner—Charles E. Atkinson
Assistant Examiner—Errol A. Krass
Attorney, Agent, or Firm—Joseph E. Rusz; George Fine

[57] ABSTRACT

An integrated quantized signal smoothing processor samples an analog signal, converts it to a digital number and averages n samples, the averages of n equal or nearly equal signals will be quantized with the quantization interval of an A/D converter. An improvement signal is added at the input of the A/D converter with the output quantization interval becoming q/n. For a given accuracy, the improvement permits a lower number of bits in the A/D converter.

2 Claims, 3 Drawing Figures

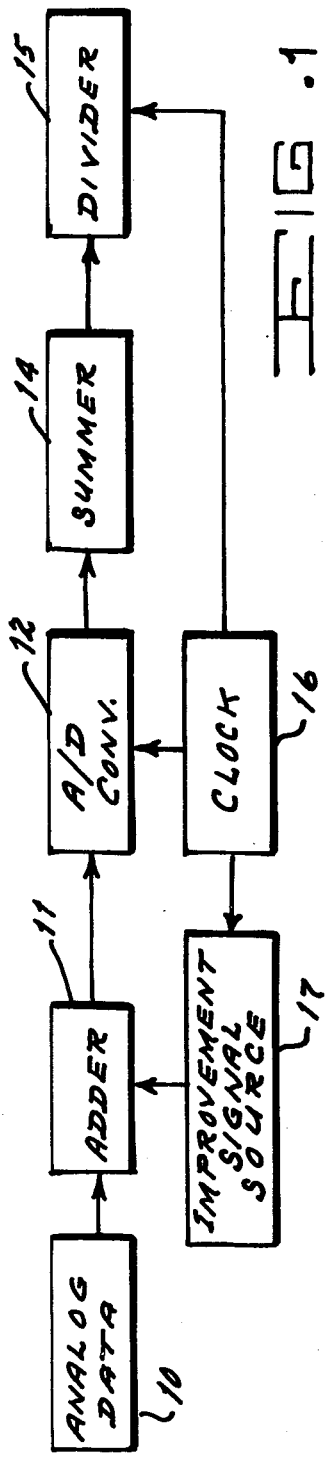
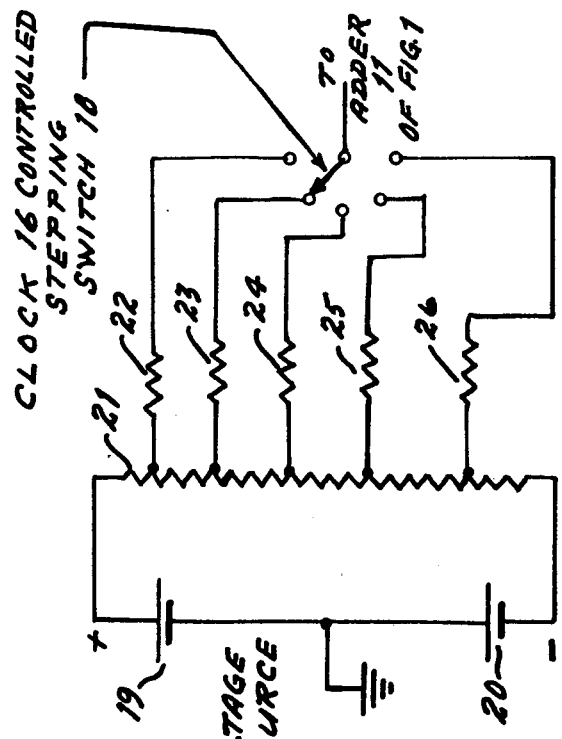
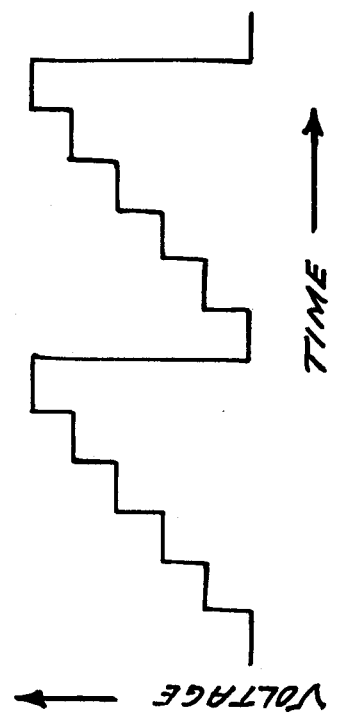

INTEGRATED QUANTIZED SIGNAL SMOOTHING PROCESSOR

STATEMENT OF GOVERNMENT INTEREST

The invention described herein may be manufactured and used by or for the Government for governmental purposes without the payment of any royalty thereon.

BACKGROUND OF THE INVENTION

In some systems analog data samples are converted to digital numbers which are quantized in steps of the quantization interval q. A number n of successive samples are then summed. The sum may then be divided by n to obtain the average. If all the n samples lie between mq and (m+1) q, m being an integer other than o the average will be seen as (m + ½) q. Thus there may be an error in the average as great as q/2. The present invention reduces the error in the sample average to q/2 n by adding an improvement signal to the analog data.

It is noted that the conventional signal processor consists of a source of analog data, an analog to digital (A/D) converter, a clock, a summing circuit and a divider. The analog data is converted to a digital signal at intervals determined by the clock. The summing circuit summed n successive digital signals, then the divider divided the sum by n and produced the output signal. The invention introduces a clock controlled improvement signal to the analog signal to reduce the error in the sample average to q/2 n.

DESCRIPTION OF THE DRAWINGS

FIG. 1 shows a preferred embodiment of the integrated quantized signal smoothing processor in block diagram form;

FIG. 2 shows a staircase voltage waveform provided by the improvement circuit component; and FIG. 3 shows one form of improvement circuit component in schematic form.

DETAILED DESCRIPTION OF THE PREFERRED EMBODIMENT

Now referring in detail to FIG. 1, there is shown analog data source 10 which feeds adder 11 analog data samples. The output from adder 11 is received by A/D converter 12. A number n of successive samples from A/D converter 12 are fed to summer 14 and then to divider 15 for division by n to obtain the average. If all the n samples lie between mq and (m+1) q the average will be seen to be (m+ ½)q. Thus there will be an error in the average as great as q/2.

It is noted the analog data is converted to a digital signal at intervals determined by clock 16. Summer 14 sums n successive digital signals, then divider 15 the sum by n and produces the output signal.

The invention introduces clock 16 controlling improvement signal source 17 and adder 11 which adds the improvement signal from improvement signal source 17 to the analog data when A/D converter 12 processes each signal from analog data source 10.

The improvement signal consists of n successive pulses. Each pulse amplitude $a_1$, is from the class $a_1 = q(2i-1)/2n - (q/2)$; i has values from 1 to n. The order of the $a_i$ is arbitrary so long as in each set of n samples each of the $a_i$ is used just once.

A simple way to generate the improvement signal is by introducing a staircase circuit which produces a staircase voltage as in FIG. 2.

In FIG. 2, n = 6. Circuits to produce such a signal are well-known.

The improvement signal works as follows. Assume the five analog signals have a uniform amplitude of (m + 0.25) q and that n = 5. Then the 5 values of the improvement signal are −0.4q, −0.2q, 0, 0.2q, 0.4q. The 5 digital values will correspond to (m − ½)q, (m + ½)q, (m + ½)q, (m + ½)q, (m + ½)q, (m + ½)q, and the average will be (m + 0.3)q. The error will be +0.05q. Without the improvement signal the error would have been 0.25q. If the analog signals had a uniform amplitude of (m + 0.2)q, the conventional average would be (m +0.5)q with an error of 0.3q. Using the improvement the average signal would be (m + 0.2)q with zero error.

Without the improvement the error range is ± 0.5q. With the improvement the error range is ± 0.5q/n.

In one system the A/D converter supplies data to over 1000 summers. To obtain the same quality output in the conventional approach would require extra bits in each of the summers as well as in the A/D converter.

Other methods of generating the improvement signal include a clock operated stepping switch which successively connects n different voltage sources to the adder as shown in FIG. 3. The stepping switch may be a solid state switching device. There is included with stepping switch 18, voltage sources 19 and 20, tapped resistor 21, and fixed resistors 21-26. The clock operated stepping switch provides another circuit for a staircase voltage to be used as the improvement signal.

What is claimed is:

1. An integrated quantized signal smoothing processor being comprised of an analog data source providing analog signals, an adder having first and second inputs and a single output, said first input receiving analog signals from said analog data source, an analog to digital converter having first and second inputs and a single output, said first input of said analog to digital converter receiving the output from said adder, a summer receiving the output from said analog to digital converter for summing a number n of successive samples, a divider receiving the output from said summer for division by the number n, an improvement signal source providing a predetermined staircase voltage signal to said second input of said adder said staircase voltage signal having n steps, and a clock controlling said divider, said analog to digital converter through its second input, and said improvement signal source to add said staircase voltage signal to said analog signals when said analog to digital converter processes each said analog signal received from said analog data source.

2. An integrated quantized signal smoothing processor as described in claim 1 wherein said signal improvement source is comprised of a stepping switch, and means to successively connect n different voltages from said stepping switch to said adder.

* * * * *